(12) United States Patent
Oh et al.

(10) Patent No.: US 11,545,602 B2
(45) Date of Patent: Jan. 3, 2023

(54) DISPLAY MODULE, DISPLAY PANEL, AND DISPLAY APPARATUS

(71) Applicant: SAMSUNG ELECTRONICS CO., LTD., Suwon-si (KR)

(72) Inventors: Pil Yong Oh, Suwon-si (KR); Kwang Jae Lee, Suwon-si (KR); Sung Soo Jung, Suwon-si (KR); Jeong In Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 131 days.

(21) Appl. No.: 16/935,420

(22) Filed: Jul. 22, 2020

(65) Prior Publication Data

US 2021/0043812 A1    Feb. 11, 2021

(30) Foreign Application Priority Data

Aug. 8, 2019 (KR) .......................... 10-2019-0096908

(51) Int. Cl.
*H01L 33/56* (2010.01)
*G02B 1/14* (2015.01)
(Continued)

(52) U.S. Cl.
CPC ................ *H01L 33/56* (2013.01); *G02B 1/14* (2015.01); *H01L 25/0753* (2013.01); *H01L 33/58* (2013.01)

(58) Field of Classification Search
CPC . H01L 33/56; H01L 27/3293; H01L 25/0753; H01L 33/58; H01L 51/0097; G02F 1/13336; G02F 1/1309; G02F 1/133528; G02F 1/13363; G02F 27/281; G02F 1/1335; G02F 1/133634; G02F 1/13338; G02F 1/134363; G02B 1/14; G02B 5/3033; G02B 5/30; G02B 27/281; G06F 3/0443; G06F 3/041; G06F 3/0446;
(Continued)

(56) References Cited

U.S. PATENT DOCUMENTS 6,683,665 B1    1/2004 Matthies
2002/0080303 A1    6/2002 Izumi
(Continued)

FOREIGN PATENT DOCUMENTS

JP    2009-227826 A    10/2009
JP    2015-225224 A    12/2015
(Continued)

OTHER PUBLICATIONS

Communication dated Nov. 13, 2020, from the European Patent Office in counterpart European Application No. 20190025.5.
(Continued)

*Primary Examiner* — Mouloucoulaye Inoussa
(74) *Attorney, Agent, or Firm* — Sughrue Mion, PLLC

(57) ABSTRACT

The display panel includes: a panel cover; an adhesive layer positioned below the panel cover; and a plurality of display modules detachably attached to the panel cover by the adhesive layer. The adhesive layer includes: a first adhesive layer positioned on the plurality of display modules, and a second adhesive layer positioned on the first adhesive layer. A peel strength of the second adhesive layer is greater than a peel strength of the first adhesive layer.

20 Claims, 9 Drawing Sheets

(51) Int. Cl.
*H01L 25/075* (2006.01)
*H01L 33/58* (2010.01)
(58) Field of Classification Search
CPC ......... G06F 1/1652; B32B 38/10; B32B 7/12;
B32B 17/10; B32B 7/06; G06V 40/1306;
G06V 40/12; C09J 7/22; C09J 7/35; C09J
7/38; G09G 3/035; G09F 9/301
USPC ................................ 428/214, 217, 337, 354
See application file for complete search history.

(56) References Cited

U.S. PATENT DOCUMENTS

| | | | | |
|---|---|---|---|---|
| 2003/0011724 | A1 | 1/2003 | Sundahl | |
| 2006/0009552 | A1* | 1/2006 | Husemann | C09J 153/00 524/80 |
| 2006/0087233 | A1* | 4/2006 | Kim | H05K 7/20963 313/46 |
| 2007/0175582 | A1* | 8/2007 | Baek | H01L 27/1266 156/247 |
| 2011/0051043 | A1* | 3/2011 | Kim | H01L 25/0753 349/64 |
| 2013/0140547 | A1* | 6/2013 | Lee | H01L 51/5256 438/46 |
| 2013/0342786 | A1* | 12/2013 | Yoon | G02F 1/1336 349/61 |
| 2014/0017466 | A1* | 1/2014 | Won | C09J 7/22 428/354 |
| 2014/0104216 | A1* | 4/2014 | Adachi | G06F 3/041 345/173 |
| 2015/0364721 | A1* | 12/2015 | Kuriyagawa | H01L 51/5253 257/88 |
| 2016/0011448 | A1* | 1/2016 | Watanabe | G06F 3/0446 345/174 |
| 2016/0370508 | A1* | 12/2016 | Jeong | G02B 5/3033 |
| 2018/0047938 | A1* | 2/2018 | Kishimoto | H01L 27/323 |
| 2018/0123009 | A1* | 5/2018 | Hong | H01L 33/62 |
| 2018/0129317 | A1* | 5/2018 | Ryu | B32B 17/10 |
| 2018/0157125 | A1* | 6/2018 | Yasui | G02B 1/16 |
| 2018/0196291 | A1* | 7/2018 | Higano | G02F 1/13452 |
| 2018/0304577 | A1* | 10/2018 | Quinn | B32B 27/36 |
| 2018/0307084 | A1* | 10/2018 | Lee | G02F 1/133308 |
| 2019/0081274 | A1* | 3/2019 | Choi | G02F 1/133305 |
| 2019/0166704 | A1 | 5/2019 | Shin et al. | |
| 2019/0340959 | A1* | 11/2019 | Park | H01L 27/322 |
| 2022/0075227 | A1* | 3/2022 | Isojima | G02B 1/14 |

FOREIGN PATENT DOCUMENTS

| | | |
|---|---|---|
| KR | 10-0751333 B1 | 8/2007 |
| KR | 10-2017-0026715 A | 3/2017 |
| KR | 10-2019-0074160 A | 6/2019 |
| WO | 2012092342 A2 | 7/2012 |
| WO | 2019/116524 A1 | 6/2019 |

OTHER PUBLICATIONS

International Search Report (PCT/ISA/210), issued by International Searching Authority in corresponding International Application No. PCT/KR2020/009214, dated Nov. 6, 2020.
Communication dated Apr. 29, 2022 by Intellectual Property India in Indian Patent Application No. 202217000006.
Communication dated Oct. 3, 2022 by the Japanese Patent Office in Japanese Patent Application No. 2021-576121.

\* cited by examiner

DISPLAY MODULE, DISPLAY PANEL, AND DISPLAY APPARATUS

CROSS-REFERENCE TO RELATED APPLICATION(S)

This application is based on and claims priority under 35 U.S.C. § 119 to Korean Patent Application No. 10-2019-0096908, filed on Aug. 8, 2019 in the Korean Intellectual Property Office, the disclosure of which is incorporated by reference herein in its entirety.

BACKGROUND

1. Field

The disclosure relates to a display module, a display panel, and a display apparatus, and more particularly, to a display apparatus having a display panel including a plurality of display modules on which a plurality of inorganic light emitting devices (ILEDs) are mounted.

2. Description of Related Art

A display apparatus visually displays images and data information, such as characters, figures, etc.

As a display apparatus, a liquid crystal panel, or an organic LED (OLED) panel formed by depositing OLEDs on a substrate has been widely used. However, the liquid crystal panel has a slow response time and high power consumption, and requires a backlight because the liquid crystal panel itself does not emit light. Accordingly, it is difficult to make a compact liquid crystal panel. Also, the OLED panel has a short life and a low mass production yield. For these reasons, as a new panel for replacing the light crystal panel and the OLED panel, a micro LED panel in which ILEDs are mounted on a substrate and the ILEDs themselves are used as pixels is being studied.

Because the micro LED panel does not require a backlight and minimizes a bezel, the micro LED panel may be reduced in size and thickness and is excellent in view of brightness, resolution, consumption power, and durability.

Also, because the micro LED panel does not require other complicated processes except for a process of picking up ILEDs from a wafer and transferring the ILEDs to a substrate, the micro LED panel may be manufactured to various resolutions and sizes according to consumers' orders and easily implemented as a large-size screen by assembling unit panel modules.

SUMMARY

Provided is a bezel-free display apparatus.

Also, provided are a display panel and a display apparatus capable of minimizing steps and/or gaps between a plurality of display modules.

Also, provided are a display panel and a display apparatus capable of easily replacing a display module of a plurality of display modules.

Additional aspects will be set forth in part in the description which follows and, in part, will be apparent from the description, or may be learned by practice of the presented embodiments.

In accordance with an aspect of the disclosure, a display panel includes: a panel cover; an adhesive layer positioned below the panel cover; and a plurality of display modules detachably attached to the panel cover by the adhesive layer, wherein the adhesive layer includes: a first adhesive layer positioned on the plurality of display modules; and a second adhesive layer positioned on the first adhesive layer, wherein peel strength of the second adhesive layer is greater than peel strength of the first adhesive layer.

The first adhesive layer may be formed of one of silicon, acryl, polyvinyl alcohol, urethane, rubber, and a combination thereof.

The second adhesive layer may be formed of one of silicon, acryl, polyvinyl alcohol, urethane, rubber, and a combination thereof.

The display panel may further include a base layer positioned between the first adhesive layer and the second adhesive layer.

The base layer may be formed of one of acryl, polyimide (PI), and ultra-thin glass (UTG).

The display panel may further include an optical film positioned on the panel cover.

The first adhesive layer and the second adhesive layer satisfy inequality (1): thickness of each adhesive layer (nm)*$\Delta n \leq 10$ nm, where $\Delta n$ represents a difference between a refractive index in a traveling direction of light and a refractive index in a direction that is perpendicular to the traveling direction of light.

Reflectivity of light transmitting through the adhesive layer may be smaller than 0.5%.

Peel strength between the plurality of display modules and the first adhesive layer may be 10 g/inch to 100 g/inch, and peel strength between the panel cover and the second adhesive layer may be 500 g/inch to 2,000 g/inch.

A thickness of the first adhesive layer and the second adhesive layer may be 20 μm to 200 μm.

In accordance with an aspect of the disclosure, a display apparatus includes: a frame; and a display panel installed in the frame, and including a panel cover, a plurality of display modules detachably attached to the panel cover, and an adhesive layer, wherein the adhesive layer includes: a first adhesive layer positioned on the plurality of display modules; and a second adhesive layer positioned on the first adhesive layer, wherein peel strength of the second adhesive layer is greater than peel strength of the first adhesive layer.

The first adhesive layer may be formed of one of silicon, acryl, polyvinyl alcohol, urethane, rubber, and a combination thereof, and the second adhesive layer is formed of one of silicon, acryl, polyvinyl alcohol, urethane, rubber, and a combination thereof.

Peel strength between the plurality of display modules and the first adhesive layer may be 10 g/inch to 100 g/inch, and peel strength between the panel cover and the second adhesive layer may be 500 g/inch to 2,000 g/inch.

The display apparatus may further include an optical film positioned on the panel cover.

The display apparatus may further include: a rear cover covering a rear side of the frame; and a device board positioned between the frame and the rear cover, and electrically connected to a panel board.

The frame may include: a frame body covering a rear side of the display panel; and an edge cover covering edges of the display panel.

In accordance with an aspect of the disclosure, a display module includes: a substrate; a plurality of ILEDs mounted on an installation surface of the substrate; a first adhesive portion positioned on each of the plurality of ILEDs; and a second adhesive portion positioned on the first adhesive portion, wherein peel strength of the second adhesive portion is greater than peel strength of the first adhesive portion.

The first adhesive layer may be formed of one of silicon, acryl, polyvinyl alcohol, urethane, rubber, and a combination thereof.

The second adhesive portion may be formed of one of silicon, acryl, polyvinyl alcohol, urethane, rubber, and a combination thereof.

The display module may further include a base portion positioned between the first adhesive portion and the second adhesive portion.

BRIEF DESCRIPTION OF THE DRAWINGS

These and other aspects, features, and advantages of certain embodiments of the present disclosure will be more apparent from the following description taken in conjunction with the accompanying drawings, in which.

DETAILED DESCRIPTION

Figure 1:
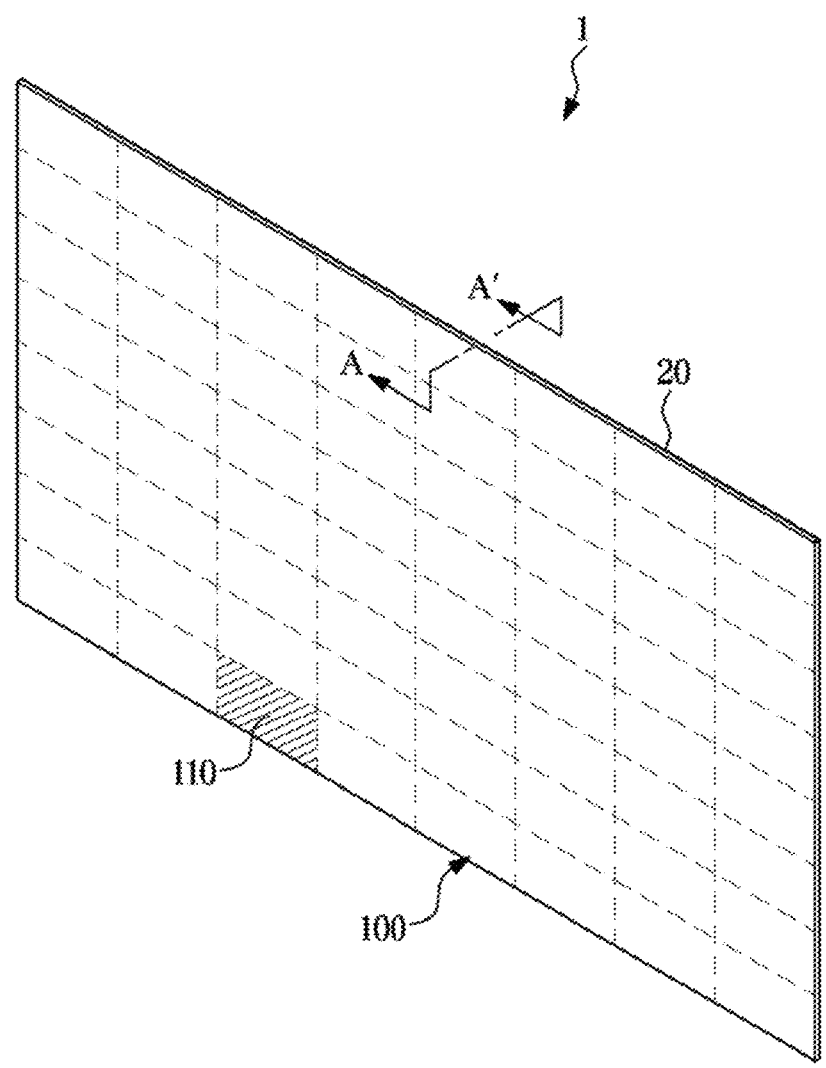
FIG. 1 shows an outer appearance of a display apparatus according to an embodiment.

Embodiments described herein are only the examples, and embodiments may be implemented in several forms and may be variously modified.

It is to be understood that the singular forms "a," "an," and "the" include plural referents unless the context clearly dictates otherwise. In the drawings, for easy understanding, the shapes, sizes, etc. of components are more or less exaggeratedly shown.

It will be understood that when the terms "includes," "comprises," "including," and/or "comprising," when used in this specification, specify the presence of stated features, figures, steps, operations, components, members, or combinations thereof, but do not preclude the presence or addition of one or more other features, figures, steps, operations, components, members, or combinations thereof.

Throughout the disclosure, the expression "at least one of a, b or c" indicates only a, only b, only c, both a and b, both a and c, both b and c, all of a, b, and c, or variations thereof.

Hereinafter, the embodiments of the disclosure will be described in detail with reference to the accompanying drawings.

Figure 2:
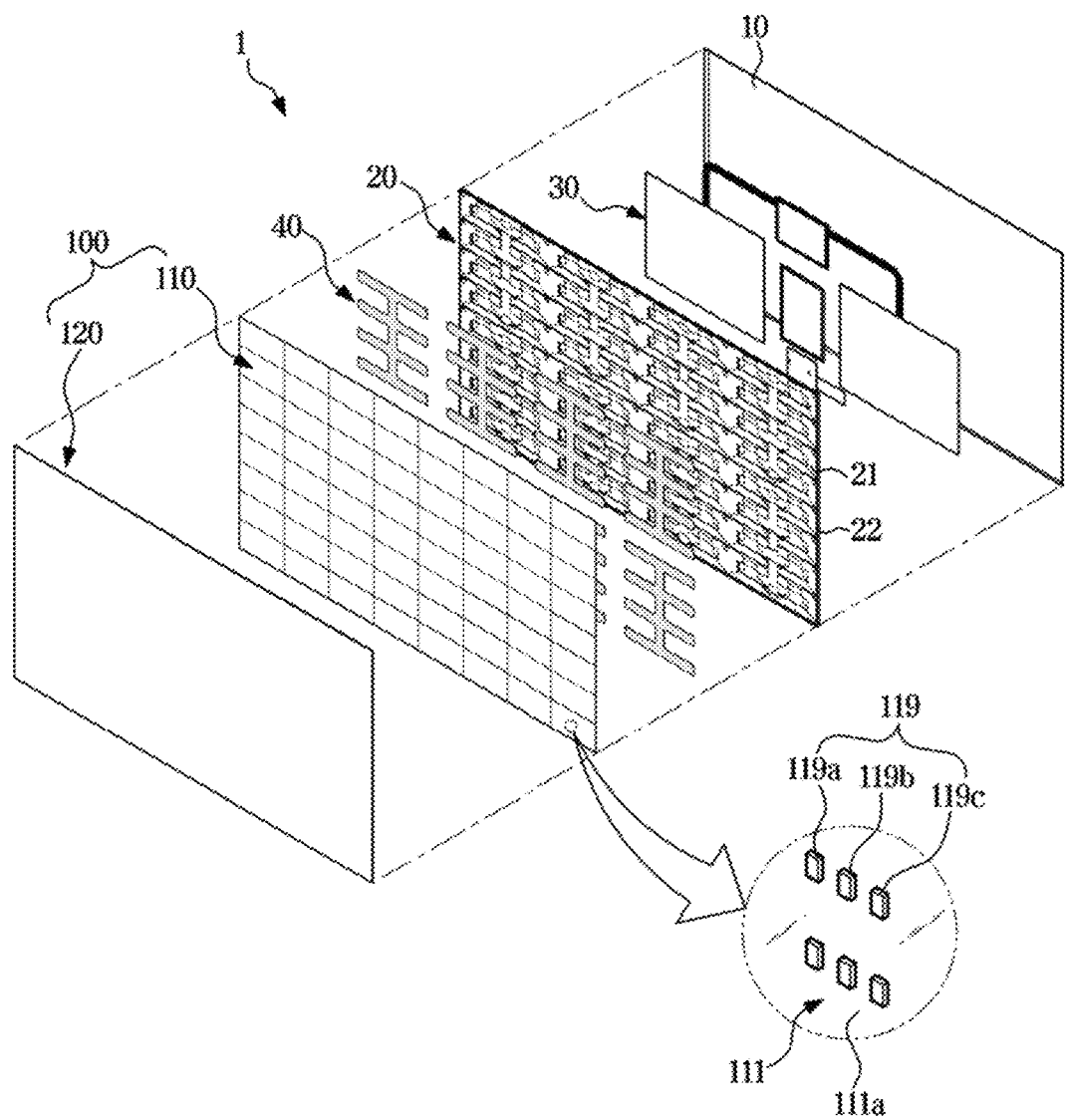
FIG. 2 is an exploded perspective view showing main components of the display apparatus shown in FIG. 1.

FIG. 1 shows an outer appearance of a display apparatus according to an embodiment. FIG. 2 is an exploded perspective view showing main components of the display apparatus shown in FIG. 1.

Referring to FIGS. 1 and 2, a display apparatus 1, which is an apparatus for displaying information and data as characters, figures, graphs, images, etc., may be a television (TV), a personal computer (PC), a mobile device, a digital signage, etc. The display apparatus 1 may be installed on a ground by a stand or on a wall.

According to an embodiment, the display apparatus 1 may include a display panel 100 for displaying images, a frame 20 supporting the display panel 100, and a rear cover 10 accommodating the display panel 100 and the frame 20. The display panel 100 installed in the frame 20 may implement a screen of the display apparatus 1.

The rear cover 10 may form a portion of the outer appearance of the display apparatus 1. The rear cover 10 may form an outer appearance of a rear side of the display apparatus 1. The rear cover 10 may cover a rear side of the frame 20.

The frame 20 may be made of a metal or a resin material to have stiffness. The frame 20 may have a nearly rectangular shape. The frame 20 may include a frame body 21 covering a rear side of the display panel 100, and an edge cover 22 formed at edges of the frame body 21. The edge cover 22 may extend toward a front direction of the display apparatus 1. The edge cover 22 may form upper, lower, and side outer appearances of the display apparatus 1. The display panel 100 may be accommodated in the frame 20 and supported by the frame 20.

The display apparatus 1 may include a device board 30 positioned between the frame 20 and the rear cover 10. The device board 30 may include a switching mode power supply for supplying power required for driving the display apparatus 1. The device board 30 may include a printed circuit board (PCB) for controlling images that are displayed on the display panel 100. The device board 30 may include a timing controller for adjusting an amount of data that is transmitted to a panel board 40 and improving image quality. The device board 30 may include a signal processing board for data processing.

The display apparatus 1 may include the panel board 40 positioned between the frame 20 and the display panel 100. The panel board 40 may control a plurality of display modules 110. The panel board 40 may be electrically connected to the plurality of display modules 110. In an embodiment, 8 panel boards 40 are provided, and the panel boards 40 are electrically connected to 8 display modules 110, respectively. However, an electrical connection structure of the panel board 40 and the plurality of display modules 110 is not limited to this. The panel board 40 may be electrically connected to the device board 30. The panel board 40 may receive power or data from the device board 30.

The display panel 100 may include the display modules 110, and a panel cover 120 positioned in front of the display modules 110. The display panel 100 may tile the display modules 110 on the panel cover 120 to implement a large screen. Details about coupling of the display modules 110 to the panel cover 120 will be described later.

Referring to FIG. 2, the display modules 110 may be arranged as an M*N matrix in up, down, left, and right directions to be adjacent to each other. In an embodiment, 64 display modules 110 may be arranged in as an 8×8 matrix on the frame 20. However, the number or arrangement of the display modules 110 are not limited to an embodiment, and may be set variously. The display modules 110 may have a flat shape or a curved shape. Also, the display modules 110 may have a variable curvature.

The display modules 110 may have the same configuration. Accordingly, descriptions about one display module 110 provided below may be applied to the other display modules 110.

The display module 110 according to an aspect of the disclosure may include a substrate 111, and one or more ILEDs 119 mounted on a front surface of the substrate 111. The front surface on which the ILEDs are mounted is also referred to as an installation surface 111a.

The substrate 111 may include a material, such as PI, FR4, glass, and the like. On the installation surface 111a of the substrate 111 on which the ILEDs are mounted, a pixel electrode, and a driving layer including a thin film transistor (TFT) may be formed. The substrate 111 may be a glass substrate. The substrate 111 may be a chip on class (COG) type substrate.

For example, the ILEDs 119a, 119b, and 119c may be formed of an inorganic material, such as silicon (Si), Sapphire, and/or gallium nitride (GaN). Because the ILEDs 119a, 119b, and 119c are more resistant to oxygen and water than OLEDs formed of an organic material, the ILEDs 119a, 119b, and 119c have a long life and excellent power efficiency.

The ILEDs 119a, 119b, and 119c may be picked up from a source wafer and mounted directly on the substrate 111. The ILEDs 119a, 119b, and 119c may be picked up and transferred through an electrostatic method using an electrostatic head, an adhesive method using an elastic polymer material, such as polydimethylsiloxane (PDMS) or silicon, as a head, laser ablation, Laser Lift Off (LLO), etc. A horizontal length, a vertical length, and a height of each of the ILEDs 119a, 119b, and 119c may be several micro meters (μm) to several hundreds of micro meters.

Each of the ILEDs 119a, 119b, and 119c may include a p-n diode and a pair of element electrodes 113, and may be in a form of a flip chip in which the pair of element electrodes 113 are arranged toward the same direction. The pair of element electrodes 113 of the ILEDs 119a, 119b, and 119c may be connected to a pair of substrate electrodes 114 through soldering. However, the ILEDs 119a, 119b, and 119c may be a lateral or vertical type, and may be connected to the substrate electrodes 114 through wires.

Referring to FIG. 2, the ILEDs 119a, 119b, and 119c may include a red ILED 119a emitting red light, a green ILED 119b emitting green light, and a blue ILED 119c emitting blue light.

A red ILED 119a, a green ILED 119b, and a blue ILED 119c may form an ILED group. The group of ILEDs 119 may form a pixel. That is, the red ILED 119a, the green ILED 119b, and the blue ILED 119c may respectively form a red sub pixel, a green sub pixel, and a blue sub pixel, which together form one pixel.

In FIG. 2, an example in which the red ILED 119a, the green ILED 119b, and the blue ILED 119c are arranged in a line is shown. However, the red ILED 119a, the green ILED 119b, and the blue ILED 119c may be arranged to form a triangle shape or any other shapes.

A plurality of ILED groups may be arranged at regular intervals. An interval between the ILED groups may be set variously according to a resolution and size of the display apparatus 1.

On the substrate 111, a black layer may be formed to absorb light between the ILEDs 119a, 119b, and 119c. On the substrate 111, an encapsulation layer may be formed to protect the ILEDs 119a, 119b, and 119c. The encapsulation layer may be formed on the substrate 111 to cover the ILEDs 119a, 119b, and 119c. The encapsulation layer may be formed of a resin, such as silicon, urethane, epoxy, acryl, and the like, or may be formed of optically clear adhesive (OCA), optically clear resin (OCR), etc. The encapsulation layer may include a viscoelastic material of which viscoelasticity and stiffness change according to a change of temperature or pressure, to physically sufficiently protect the ILEDs 119a, 119b, and 119c and improve image quality. The viscoelastic material may include at least one of silicon, urethane, epoxy, or an acrylic compound.

Figure 3:
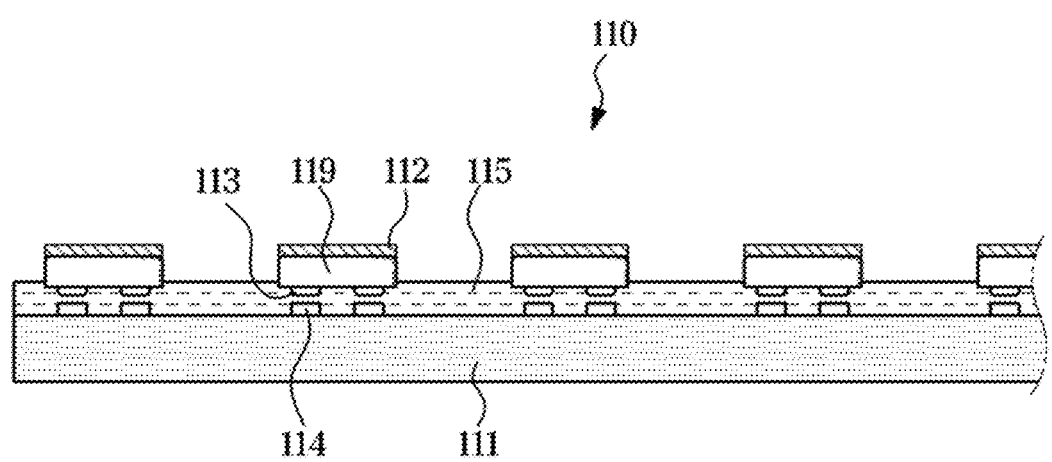
FIG. 3 is a side cross-sectional view of a display module according to an embodiment.

FIG. 3 is a side cross-sectional view of the display module 110 according to an embodiment.

Referring to FIG. 3, on the substrate 111, the pair of substrate electrodes 114 electrically connected to the pair of element electrodes 113 may be provided.

To electrically connect the ILEDs 119 to the substrate 111, a conductive bonding layer 115 may be formed on the substrate 111. The conductive bonding layer 115 may be formed on the entire area of the substrate 111. The conductive bonding layer 115 may enable electrical connections between the pair of element electrodes 113 and the pair of substrate electrodes 114.

As such, by electrically connecting the element electrodes 113 of the ILEDs 119 to the substrate electrodes 114 of the substrate 111 by using the conductive bonding layer 115, the ILEDs 119 may be prevented from being damaged during a bonding process, reliability of bonding may be improved, and a bonding process may be simplified.

According to an embodiment, the display module 110 may further include an adhesive portion 112 of a transparent material formed on each of the ILEDs 119.

In the related art, a display panel is attached to a panel cover by using an OCA which is a single layer. However, it is difficult to separate the display panel from the panel cover due to a strong adhesive force of the OCA when a display apparatus needs to be reworked due to a panel defect after the display apparatus is manufactured and assembled.

According to an embodiment, by applying the adhesive portion 112 of the transparent material on the ILEDs 119 of the display module 110, that is, in a light-emitting direction, the display panel 100 may be adhered to the panel cover 120 with a level of an adhesive force by which the display panel 100 is separable from the panel cover 120. More specifically, because the adhesive portion 112 has a relatively strong adhesive force with respect to the panel cover 120 and a relatively weak adhesive force with respect to the ILEDs 119, reworking may be allowed and a separation force may be significantly reduced, resulting in high reworking efficiency.

According to an embodiment, the adhesive portion 112 may include a first adhesive portion provided on each of the ILEDs 119, and a second adhesive portion provided on the first adhesive portion and having greater peel strength than that of the first adhesive portion. That is, the adhesive portion 112 may be configured with the first adhesive portion and the second adhesive portion and attached to the ILED 119 of the display module 110. The first adhesive portion and the second adhesive portion may have a shape corresponding to that of the ILED 119.

The first adhesive portion may be formed on the ILED 119 of the display module 110. The first adhesive portion may be formed of an optically isotropic material which is any one of silicon, acryl, polyvinyl alcohol, urethane, rubber, and a combination thereof.

The second adhesive portion may be provided on the first adhesive portion. The second adhesive portion may be formed of a material having relatively greater peel strength than the first adhesive portion. For example, the second adhesive portion may be formed of an optically isotropic material which is any one of silicon, acryl, polyvinyl alcohol, urethane, rubber, and a combination thereof.

The first adhesive portion and the second adhesive portion may have a thickness of 10 μm to 60 μm. When the thickness of the adhesive portion 112 is too thick, it may be difficult to ensure a viewing angle when surface treatment such as printing a black pattern is performed on the panel cover 120 as necessary, and also it may be difficult to ensure price competitiveness. Also, when the thickness of the adhesive portion 112 is too thin, it may be difficult to ensure strength so that the adhesive portion 112 may be easily torn.

A method of attaching the first adhesive portion and the second adhesive portion to the ILEDs 119 of the display module 110 may be implemented by forming a film, a molding, etc. having adhesion on the display module 110, although not limited thereto. However, the method may be performed by using any method known to those skilled in the art.

The adhesive portion 112 of the transparent material configured with the first adhesive portion and the second adhesive portion described above may be formed on some of the ILEDs 119 in consideration of an adhesive force with the display module 110.

The display module 110 according to an embodiment may further include a base portion between the first adhesive portion and the second adhesive portion. The base portion may have a shape corresponding to the first adhesive portion and the second adhesive portion.

By applying the base portion between the first adhesive portion and the second adhesive portion, a relatively strong adhesive force with respect to the panel cover 120 and a relatively weak adhesive force with respect to the ILEDs 119 may be achieved.

The base portion may be formed of an optically isotropic material which is any one of acryl, PI and UTG. A thickness of the base portion may be 40 μm or more in consideration of an adhesive force and stability with the first adhesive portion and the second adhesive portion.

For example, by performing surface treatment on both surfaces of an adhesive layer, the second adhesive portion may be formed on the base portion and the first adhesive portion may be formed below the base portion.

The surface treatment for forming the first adhesive portion and the second adhesive portion on both surfaces of the base portion is not limited, and may be chemical treatment or mechanical etching known to those skilled in the art. For example, the chemical treatment may be primer treatment using urethane, silicon, etc., and the mechanical etching may be corona discharge treatment or gas plasma treatment using oxygen, argon, ozone, etc.

The display panel 100 according to an embodiment may include the panel cover 120, and the plurality of display modules 110 detachably attached to the panel cover 120.

Figure 4:
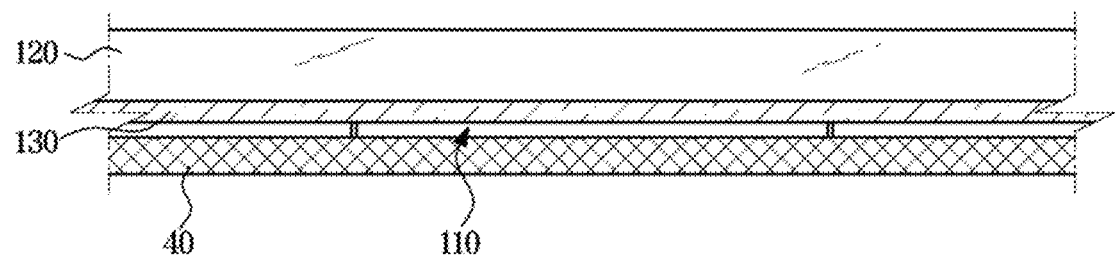
FIG. 4 shows a portion of a cross section taken along line A-A' of FIG. 1.

FIG. 4 shows a portion of a cross section taken along line A-A' of FIG. 1.

Referring to FIG. 4, the panel cover 120 for protecting and supporting the plurality of display modules 110 may be attached to the front surfaces of the display modules 110. The panel cover 120 may include glass. An adhesive layer 130 of a transparent material may be provided between the display modules 110 and the panel cover 120 and may be similar to the adhesive portion 112. Accordingly, the display modules 110 may be detachably attached to the panel cover 120.

According to an embodiment, by applying the adhesive layer 130 to the display modules 110, the display panel 100 may be adhered to the panel cover 120 with a level of an adhesive force by which the display panel 100 is separable from the panel cover 120.

More specifically, because the adhesive layer 130 has a relatively strong adhesive force with respect to the panel cover 120 and a relatively weak adhesive force with respect to the display modules 110, reworking may be allowed and a separation force may be significantly reduced, resulting in high reworking efficiency.

Accordingly, an adhesive force between the adhesive layer 130 and the panel cover 120 may be greater than an adhesive force between the adhesive layer 130 and the display module 110, which gives an effect of satisfying a separation force upon reworking while maintaining a coupling force between the display modules 110 and the panel cover 120.

Figure 5:
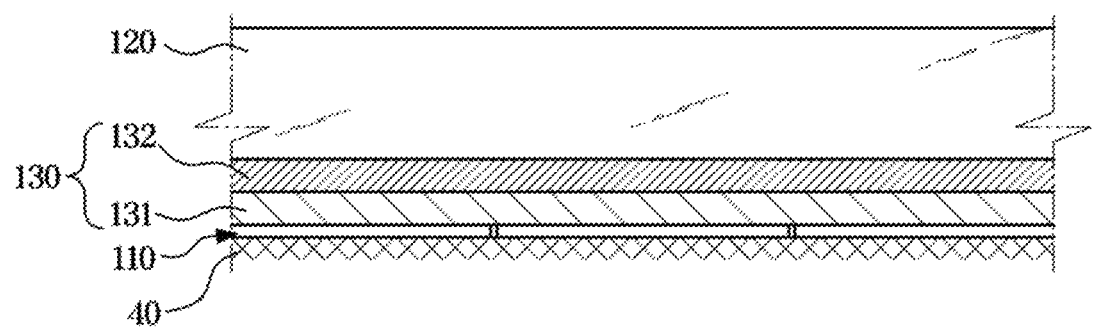
FIG. 5 is an enlarged view of an adhesive layer of a display panel according to an embodiment.

FIG. 5 is an enlarged view of the adhesive layer 130 of the display panel 100 according to an embodiment.

According to an embodiment, the adhesive layer 130 of the transparent material may include a first adhesive layer 131 formed on the display modules 110, and a second adhesive layer 132 formed on the first adhesive layer 131 and having greater peel strength than the first adhesive layer 131. That is, the adhesive layer 130 may be configured with the first adhesive layer 131 and the second adhesive layer 132 and attached to the display modules 110. The first adhesive layer 131 and the second adhesive layer 132 may have a shape corresponding to that of the panel cover 120. For example, the first adhesive layer 131 and the second adhesive layer 132 may be a film, a molding, etc., although not limited thereto.

Also, the adhesive layer 130 may have a relatively weak adhesive force with respect to the panel cover 120 and a relatively strong adhesive force with respect to the display modules 110.

The first adhesive layer 131 may be formed on the display modules 110. The first adhesive layer 131 may be formed of an optically isotropic material which is any one of silicon, acryl, polyvinyl alcohol, urethane, rubber, and a combination thereof.

The second adhesive layer 132 may be formed on the first adhesive layer 131 of a material having greater peel strength than the first adhesive layer 131. For example, the second adhesive layer 132 may be formed of an optically isotropic material which is any one of silicon, acryl, polyvinyl alcohol, urethane, rubber, and a combination thereof.

The first adhesive layer 131 and the second adhesive layer 132 may have a thickness a of 20 μm or more. For example, the first adhesive layer 131 and the second adhesive layer 132 may have a thickness a of 20 μm to 200 μm. The thickness of the first adhesive layer 131 and the second adhesive layer 132 may be selected according to strength of the display modules 110. When the thickness of the first adhesive layer 131 and the second adhesive layer 132 increases, it may be possible to increase the radius of curvature in a reworking process, which improves workability. However, when the thickness of the first adhesive layer 131 and the second adhesive layer 132 is too thin, it may be difficult to ensure strength, so that the first adhesive layer 131 and the second adhesive layer 132 may be easily torn.

Figure 6:
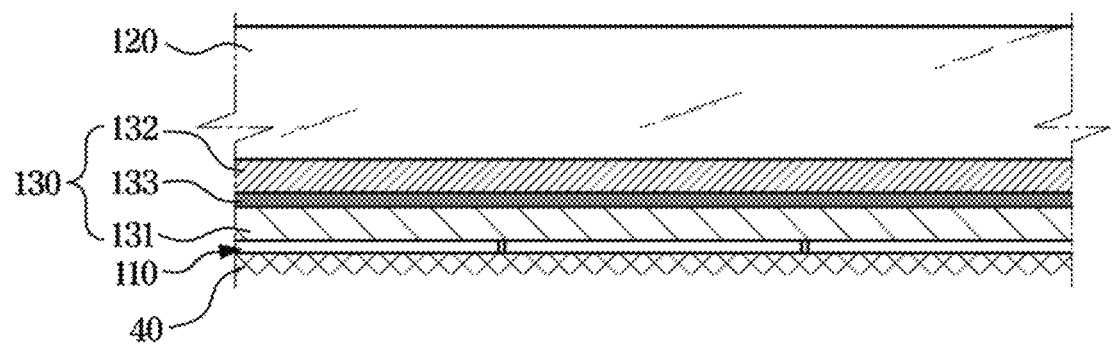
FIG. 6 is an enlarged view of an adhesive layer of a display panel according to an embodiment.

FIG. 6 is an enlarged view of an adhesive layer of a display panel according to another embodiment.

The display panel 100 according to an embodiment may further include a base layer 133 between the first adhesive layer 131 and the second adhesive layer 132. The base layer 133 may have a shape corresponding to that of the first adhesive layer 131 and the second adhesive layer 132.

By applying the base layer 133 between the first adhesive layer 131 and the second adhesive layer 132, a relatively strong adhesive force with respect to the panel cover 120 and a relatively weak adhesive force with respect to the display modules 110 may be achieved.

The base layer 133 may be formed of an optically isotropic material which is any one of acryl, PI, and UTG. A thickness of the base layer 133 may be 40 μm or more in consideration of an adhesive force and stability with the first adhesive layer 131 and the second adhesive layer 132.

For example, by performing surface treatment on both surfaces of the base layer 133, the second adhesive layer 132 may be formed on the base layer 133 and the first adhesive layer 131 may be formed below the base layer 133.

The surface treatment for forming the first adhesive layer 131 and the second adhesive layer 132 on both surfaces of the base layer 133 is not limited, and may be chemical treatment or mechanical etching known to those skilled in the art. For example, the chemical treatment may be primer treatment using urethane, silicon, etc., and the mechanical etching may be corona discharge treatment or gas plasma treatment using oxygen, argon, ozone, etc.

When the panel cover 120 is formed of glass, peel strength between the display modules 110 and the first adhesive layer 131 may be 10 g/inch to 100 g/inch, and peel strength between the panel cover 120 and the second adhesive layer 132 may be 500 g/inch to 2,000 g/inch.

The peel strength is the measure of the average force to part two bonded materials. For example, the strength may be calculated during a peel test at a constant speed rate and measured as the average load per unit.

Referring to FIGS. 5 and 6, by applying the adhesive layer 130 having different adhesive forces with respect to the display modules 110 and the panel cover 120, a coupling force between the display modules 110 and the panel cover 120 may be maintained uniform over the entire area of the display modules 110, and the panel cover 120 may be easily separated in an up-down direction from the display modules 110 upon reworking, thereby preventing a quality defect that the display panel 100 lifts.

According to an embodiment, the display panel 100 may further include an optical film formed on the panel cover 120 to improve optical performance. As the optical film, a circular polarizing film, a linear polarizing film, a retardation film, an antiglare (AG) film, a low-reflection (LR) film, an antireflective (AR) film, a hard-coating (HC) film, a neural density (ND) film, any combination thereof, etc. may be used alone or in combination through stacking of two or more films, to improve image quality. Also, surface treatment such as printing a black pattern may be performed on the panel cover 120.

For example, polyethylene terephthalate (PET), which is the base layer 133 used in the adhesive layer 130 for adhesion between the panel cover 120 and the display modules 110, may have optical anisotropy by a stretching process.

When the adhesive layer 130 applied between the display modules 110 and the panel cover 120 has optical anisotropy, retardation may occur in light passing through the adhesive layer 130. For example, when light having a wavelength of 550 nm is transmitted through a PET film having a thickness of 10 μm, a path difference corresponding to 3.6λ (wavelength) may be generated. Accordingly, light distortion may occur, which disables the adhesive layer 130 to function as an optical film.

Inventors of the present disclosure have deduced retardation b that is expressed by the following inequality (1), by providing the adhesive layer 130 formed of the isotropic material (i.e., the isotropic adhesive layer) and considering the thickness of the adhesive layer 130 and a visible light wavelength range of 400 nm to 700 nm. The isotropic adhesive layer 130 may be a film in which a refractive index in a fast axis direction, a reflective index in a slow axis direction, and a reflective index in a thickness direction are in a substantially equivalent range.

According to an embodiment, the first adhesive layer 131 and the second adhesive layer 132 constituting the adhesive layer 130 of the display panel 100 may satisfy inequality (1) below.

$$a\ (\text{nm}) * \Delta n \leq b = 10\ \text{nm}, \qquad \text{Inequality (1):}$$

where a is an overall thickness of the adhesive layer, b is a retardation to be equal to or less than 10 nm, and Δn represents a difference between a refractive index in a traveling direction of light and a refractive index in a direction that is perpendicular to the traveling direction of light.

Figure 7:
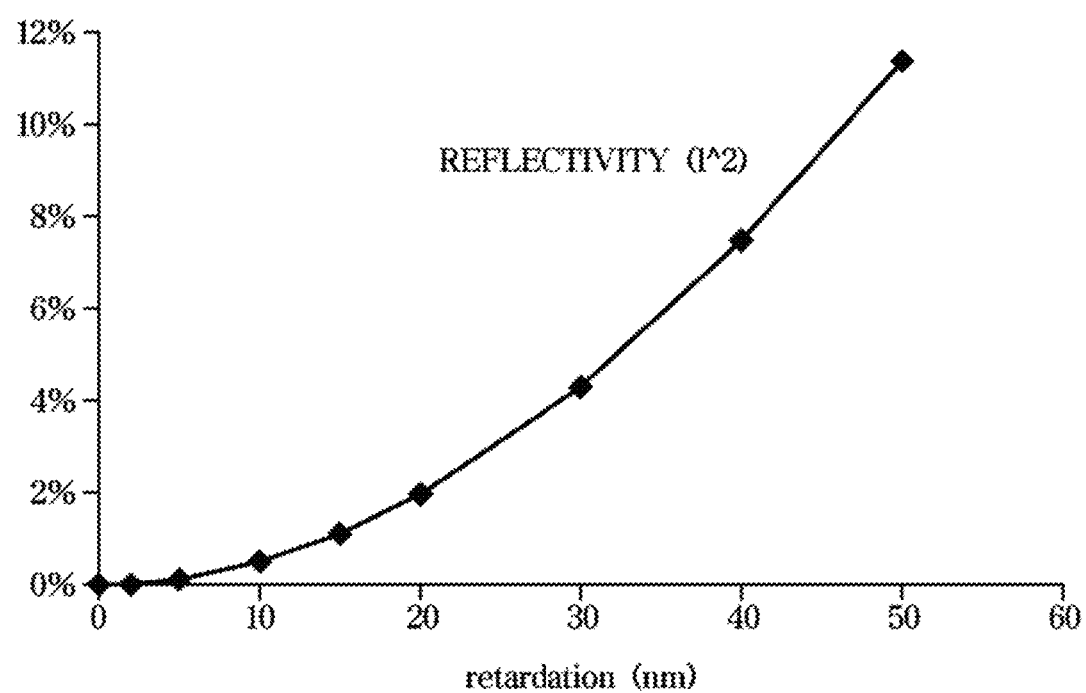
FIG. 7 is a graph showing a relationship between retardation and reflectivity of an adhesive layer according to an embodiment.

FIG. 7 is a graph showing a relationship between retardation and reflectivity of the adhesive layer 130 according to an embodiment.

Referring to FIG. 7, when retardation of light transmitted through the adhesive layer 130 is controlled to be smaller than or equal to 10 nm, reflectivity that is smaller than 0.5% is deduced. Accordingly, it is confirmed that the adhesive layer 130 functions as an optical film.

To control the retardation of light to be smaller than or equal to 10 nm, the adhesive layer 130 may be formed of an isotropic material which is any one of silicon, acryl, polyvinyl alcohol, urethane, rubber, and a combination thereof. For example, the first adhesive layer 131 and the second adhesive layer 132 may be formed of any one of colorless and transparent PI (CPI), pressure sensitive adhesive (PSA) acryl, polyester, poly carbonate, cyclo olefin polymer (COP), casting polypropylene (CPP), and glass.

According to an embodiment, because the display panel 100 includes the adhesive layer 130 formed as the isotropic adhesive layer, retardation of light transmitted through the adhesive layer 130 may be reduced. For example, light transmitted through the adhesive layer 130 may have retardation of about 10 nm or less.

Accordingly, the display panel 100 according to an embodiment does not cause performance deterioration such as light distortion even when an optical film is further formed on the panel cover 120.

Figure 8A:
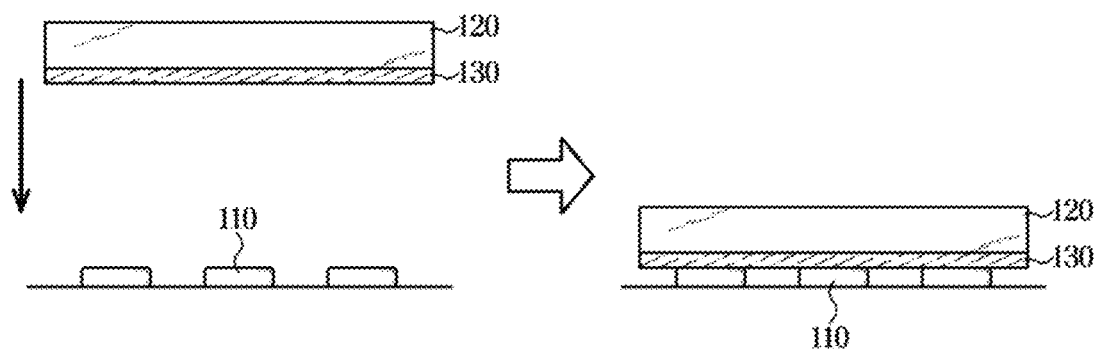
FIGS. 8A and 8B show examples of an assembly method and a rework method of a display panel according to an embodiment.
Figure 8B:
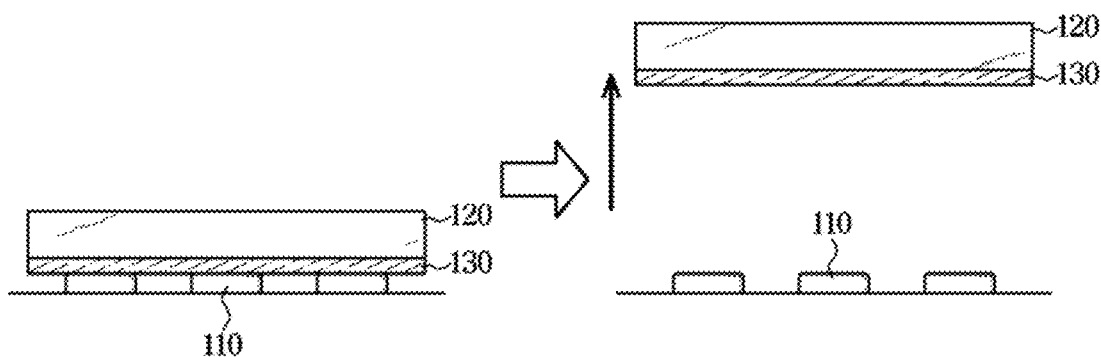

FIGS. 8A and 8B show examples of an assembly method and a rework method of the display panel 100 according to an embodiment.

Referring to FIG. 8A, by attaching the panel cover 120 including the adhesive layer 130 to the plurality of display modules 110, the display panel 100 may be assembled.

The display apparatus 1 according to an embodiment may be configured to allow, when a display module of the plurality of display modules 110 needs to be replaced, easy replacement of the display module.

More specifically, referring to FIG. 8B, when a defect is generated in a display module of the plurality of display modules 110 so that reworking is needed, a worker may first separate the panel cover 120 of the display apparatus 1 from the display modules 110.

Because an adhesive force between the adhesive layer 130 and the display modules 110 is weaker than an adhesive force between the adhesive layer 130 and the panel cover 120, the worker may separate the panel cover 120 from the display modules 110 in a state in which the adhesive force between the adhesive layer 130 and the panel cover 120 is maintained, thereby increasing reworking efficiency of the display apparatus 1 having a small area.

Because the display apparatus 1 according to an embodiment includes the display panel 100 in which the plurality of display modules 110 are installed on the panel cover 120, a front chassis for supporting the display modules 110 may be omitted. That is, because the panel cover 120 supporting the display modules 110 is supported by the frame 20, the display apparatus 1 according to an embodiment may minimize a bezel. That is, the display apparatus 1 according to an embodiment may be implemented as a bezel-free type.

In addition, because the display apparatus 1 according to an embodiment adopts a front side direct attachment method in which the display modules 110 are installed on the panel cover 120, the display apparatus 1 may minimize steps between modules.

According to an embodiment, because the display apparatus attaches the plurality of display modules to the panel cover, a bezel for assembling and/or holding the display modules may be omitted.

According to an embodiment, because the display panel and the display apparatus integrate the display panel by attaching the plurality of display modules to the panel cover, steps and/or gaps between the display modules may be reduced.

According to an embodiment, because the display panel and the display apparatus allow easy separation in up-down direction of the display modules and the panel cover, reworking efficiency may increase.

While embodiments have been particularly shown and described with reference to the drawings, the embodiments are provided for the purposes of illustration and it will be understood by one of ordinary skill in the art that various modifications and equivalent other embodiments may be made from the disclosure. Accordingly, the true technical scope of the disclosure is defined by the technical spirit of the appended claims.

What is claimed is:

1. A display panel comprising:
a panel cover;
an adhesive layer provided below the panel cover; and
a plurality of display modules arranged in a matrix and detachably attached to the panel cover by the adhesive layer,
wherein the adhesive layer comprises:
a first adhesive layer provided on an upper side of the plurality of display modules, and
a second adhesive layer provided on the first adhesive layer,
wherein a peel strength of the second adhesive layer is greater than a peel strength of the first adhesive layer,
wherein each of the plurality of display modules is configured to be attached to and detached from the panel cover via the adhesive layer, individually and separately from remaining display modules of the plurality of display modules,
wherein each of the plurality of display modules comprises:
a plurality of inorganic light emitting devices, and
an adhesive portion having a shape which follows a shape of the plurality of inorganic light emitting devices, respectively,
wherein the adhesive portion comprises:
a first adhesive portion provided on the plurality of inorganic light emitting devices, and
a second adhesive portion provided on the first adhesive portion, and
wherein a peel strength of the second adhesive portion is greater than a peel strength of the first adhesive portion.

2. The display panel according to claim 1, wherein the first adhesive layer is formed of one of silicon, acryl, polyvinyl alcohol, urethane, rubber, or any combination thereof.

3. The display panel according to claim 1, wherein the second adhesive layer is formed of one of silicon, acryl, polyvinyl alcohol, urethane, rubber, or any combination thereof.

4. The display panel according to claim 1, further comprising a base layer provided between the first adhesive layer and the second adhesive layer.

5. The display panel according to claim 4, wherein the base layer is formed of one of acryl, polyimide, or ultra-thin glass.

6. The display panel according to claim 1, further comprising an optical film provided on the panel cover.

7. The display panel according to claim 6, wherein a relationship of a thickness of the adhesive layer and a retardation satisfy a following inequality:

$$a \text{ (nm)} * \Delta n \leq b = 10 \text{ nm,}$$

where a is the thickness of the adhesive layer,
b is the retardation, and
$\Delta n$ represents a difference between a refractive index in a traveling direction of light and a refractive index in a direction that is perpendicular to the traveling direction of light, with respect to the adhesive layer.

8. The display panel according to claim 6, wherein a reflectivity of light transmitted through the adhesive layer is smaller than 0.5%.

9. The display panel according to claim 1, wherein the peel strength between each of the plurality of display modules and the first adhesive layer is in a range of 10 g/inch to 100 g/inch, and
the peel strength between the panel cover and the second adhesive layer is in a range of 500 g/inch to 2,000 g/inch.

10. The display panel according to claim 1, wherein a thickness of the first adhesive layer and the second adhesive layer is in a range of 20 μm to 200 μm.

11. A display apparatus comprising:
a frame; and
a display panel installed in the frame, and comprising:
a panel cover,
a plurality of display modules arranged in a matrix and detachably attached to the panel cover, and
an adhesive layer,
wherein the adhesive layer comprises:
a first adhesive layer provided on an upper side of the plurality of display modules, and
a second adhesive layer provided on the first adhesive layer,
wherein a peel strength of the second adhesive layer is greater than a peel strength of the first adhesive layer,
wherein each of the plurality of display modules is configured to be attached to and detached from the panel cover via the adhesive layer, individually and separately from remaining display modules of the plurality of display modules,
wherein each of the plurality of display modules comprises:
a plurality of inorganic light emitting devices, and
an adhesive portion having a shape which follows a shape of the plurality of inorganic light emitting devices, respectively, wherein the adhesive portion comprises:
  a first adhesive portion provided on the plurality of inorganic light emitting devices, and
  a second adhesive portion provided on the first adhesive portion, and
wherein a peel strength of the second adhesive portion is greater than a peel strength of the first adhesive portion.

12. The display apparatus according to claim 11, wherein the first adhesive layer is formed of one of silicon, acryl, polyvinyl alcohol, urethane, rubber, or any combination thereof, and
  the second adhesive layer is formed of one of silicon, acryl, polyvinyl alcohol, urethane, rubber, or any combination thereof.

13. The display apparatus according to claim 11, wherein the peel strength between each of the plurality of display modules and the first adhesive layer is in a range of 10 g/inch to 100 g/inch, and
  the peel strength between the panel cover and the second adhesive layer is in a range of 500 g/inch to 2,000 g/inch.

14. The display apparatus according to claim 11, further comprising an optical film provided on the panel cover.

15. The display apparatus according to claim 11, further comprising:
  a rear cover covering a rear side of the frame; and
  a device board provided between the frame and the rear cover; and
  a panel board provided between the device board and the panel cover and electrically connected to the device board and the plurality of display modules.

16. The display apparatus according to claim 11, wherein the frame comprises:
  a frame body covering a rear side of the display panel; and
  an edge cover covering edges of the display panel.

17. A display module comprising:
  a substrate;
  a plurality of inorganic light emitting devices (ILEDs) mounted on an installation surface of the substrate; and
  an adhesive portion provided on an upper side of each of the plurality of ILEDs, wherein the adhesive portion comprises:
    a first adhesive portion positioned on the plurality of ILEDs, and
    a second adhesive portion provided on the first adhesive portion,
  wherein a peel strength of the second adhesive portion is greater than a peel strength of the first adhesive portion, and
  wherein the first adhesive portion and the second adhesive portion have a shape which follows a shape of the plurality of ILEDs, respectively.

18. The display module according to claim 17, wherein the first adhesive portion is formed of one of silicon, acryl, polyvinyl alcohol, urethane, rubber, or any combination thereof.

19. The display module according to claim 17, wherein the second adhesive portion is formed of one of silicon, acryl, polyvinyl alcohol, urethane, rubber, or any combination thereof.

20. The display module according to claim 17, further comprising a base layer provided between the first adhesive portion and the second adhesive portion.

* * * * *